United States Patent [19]

Suda et al.

[11] 4,072,767
[45] Feb. 7, 1978

[54] METHOD FOR CONTROLLING CHEMICAL VAPOR DEPOSITION

[75] Inventors: Kyo Suda, Hachioji; Katsumi Takami, Tokyo; Akira Shintani; Shinobu Hase, both of Hachioji, all of Japan

[73] Assignee: Hitachi, Ltd., Japan

[21] Appl. No.: 693,312

[22] Filed: June 7, 1976

[30] Foreign Application Priority Data

June 6, 1975 Japan .................................. 50-67645

[51] Int. Cl.² ........................ C23C 13/04; C01B 33/12
[52] U.S. Cl. ............................................ 427/8; 427/10
[58] Field of Search ................................ 427/8, 10, 95

[56] References Cited

U.S. PATENT DOCUMENTS 3,607,378   9/1971   Ruggiero ............................... 427/95

Primary Examiner—James R. Hoffman
Attorney, Agent, or Firm—Craig & Antonelli

[57] ABSTRACT

In forming a film of a purposive substance on a substrate by a chemical vapor deposition (CVD), the size of the film-forming substance particles formed in a reactor is detected as an electrical signal and flow rates of respective gases introduced into the reactor are controlled in response to this electrical signal. According to this control method, the fogging phenomenon owing to formation of the film-forming substance in the gas flow can be effectively prevented.

25 Claims, 14 Drawing Figures

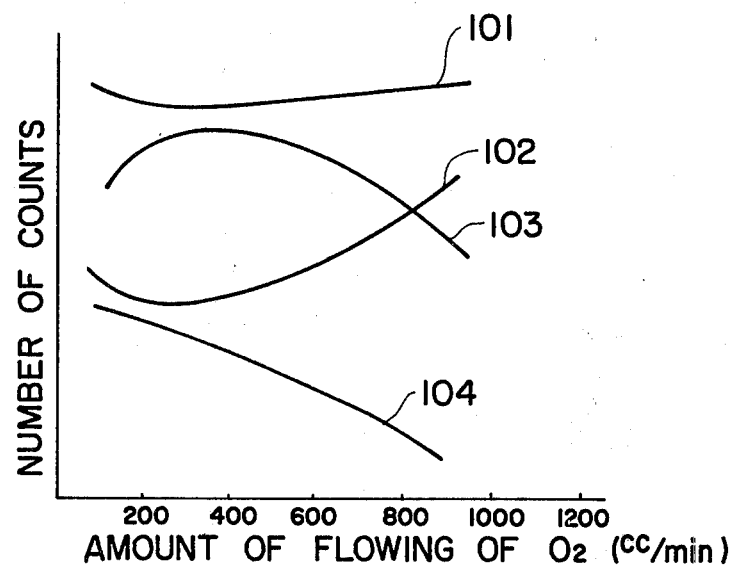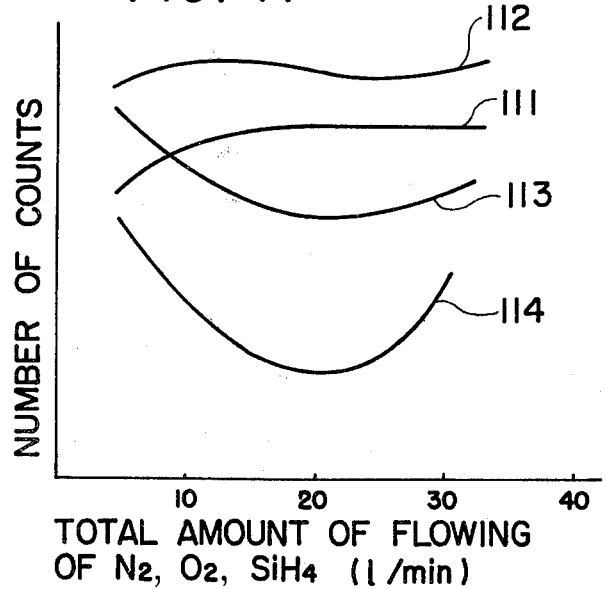

METHOD FOR CONTROLLING CHEMICAL VAPOR DEPOSITION

BACKGROUND OF THE INVENTION

The present invention relates to a method for controlling chemical vapor deposition (CVD).

In general, the films grown utilizing a C V D have heretofore been conducted according to the following method.

A reacting gas A and a mixed gas B are introduced into a reactor, and a substrate on which a film is to be formed is heated in the reactor, whereby a film is formed on the surface of the substrate. The kinds of the reacting gas A and mixed gas B are changed depending on the material of the film to be formed. For example, when it is intended to deposit $SiO_2$ films, $O_2$ is used as the reacting gas A and a mixed gas of $N_2$ and $SiH_4$ is used as the mixed gas B. In case phosphorus is doped in the $SiO_2$ film, $PH_3$ is additionally admitted into the mixed gas B of $N_2$ and $SiH_4$. When it is intended to form $Si_3N_4$ films, $NH_3$ is used as the reacting gas A and a mixed gas of $N_2$ and $SiH_4$ is used as the mixed gas B. Also the substrate temperature is changed depending on the material of the film to be formed. For example, in the case of $SiO_2$ films, the substrate is heated at about 400° C, and in the case of $Si_3N_4$, the substrate is heated at about 900° C. In order to obtain a homogeneous composition of the film and uniform film in the thickness, the substrate is placed on a susceptor and this susceptor is subjected to rotation and revolution. Further, at the film-forming step, the total gas pressure in the reactor is maintained at substantially one atmosphere.

For films deposited by this method, it is required that the composition should be homogeneous throughout the entire surfaces of the substrates; the thickness should be uniform and such defects as pin holes and flakes should not be formed.

However, films formed by the C V D are not always satisfactory in the foregoing points. One of the causes is the so-called fogging phenomenon, that is large particles of the film-forming substance fall on the substrate. This phenomenon is explained as follows:

In some combination of the reacting gas A and mixed gas B to be reacted with each other, the reaction between the reactants proceeds very promptly. Therefore, the moment reactants are introduced into the reactor, particles of the film-forming substance are formed. As the particles move in the reactor towards the substrate disposed below in the reactor, they grow and large particles come to fall on the substrate. When this fogging phenomenon takes place, these large particles are mingled with the film-forming substance to be deposited on the substrate, such as silicon wafer, and defects such as pin holes and flakes are caused on the resulting film.

SUMMARY OF THE INVENTION

It is therefore a primary object of the present invention to provide a method for controlling the C V D, according to which good quality films can be obtained.

Another object of the present invention is to provide a control method, according to which occurrence of the fogging phenomenon is effectively prevented in the C V D.

These and other objects of the present invention will be more apparent from the following description.

Flow rates of respective gases participating in the C V D were separately changed, or flow rates of two or more of gases participating in the reaction were changed simultaneously, and the particle size distribution of particles of a film-forming substance, such as $SiO_2$, formed in the reactor were measured. As a result, it was found that the particle size of the film-forming substance can be controlled by controlling the flow rates of the respective gases and occurrence of the fogging phenomenon can be prevented by this control.

In accordance with the present invention, the foregoing and other objects can be attained by amethod in which in forming a film of a prescribed substance on a substrate by C V D, the size of particles of the film-forming substance formed in the reactor is detected as an electrical signal and the flow rates of gases to be introduced into the reactor are controlled in response to this electric signal.

BRIEF DESCRIPTION OF THE DRAWINGS

FIGS. 8 to 11 are curves showing relations between the numbers of counts of film-forming substance particles and flow rates of gases.

DETAILED DESCRIPTION OF THE PREFERRED EMBODIMENTS

Figure 1:
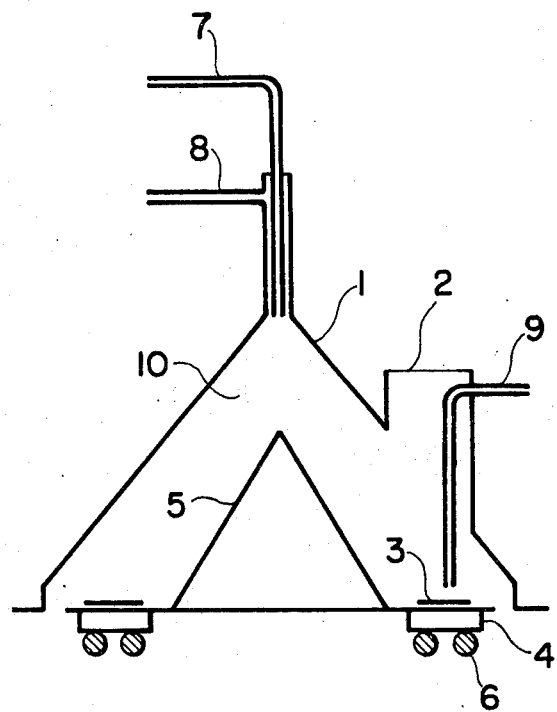
FIG. 1 is a cross section of one type of the C V D apparatus.

Referring now to FIG. 1 which is a cross sectional view of an embodiment of the C V D apparatus, it will be seen that the apparatus comprises a belljar 1, a susceptor 4 on which the substrate 3 is placed, a buffer 5 for dispersing the reacting gas uniformly in the reactor and a heater 6 for heating the susceptor 4. The belljar 1 includes inlet nozzles 7 and 8 for introducing the reacting gas A and mixed gas B into the reactor, a peep window 2 for monitoring of the thickness of a formed film and an aerosol suction nozzle 9, and the total gas pressure in the reactor is maintained at about one atmosphere.

Figure 2:
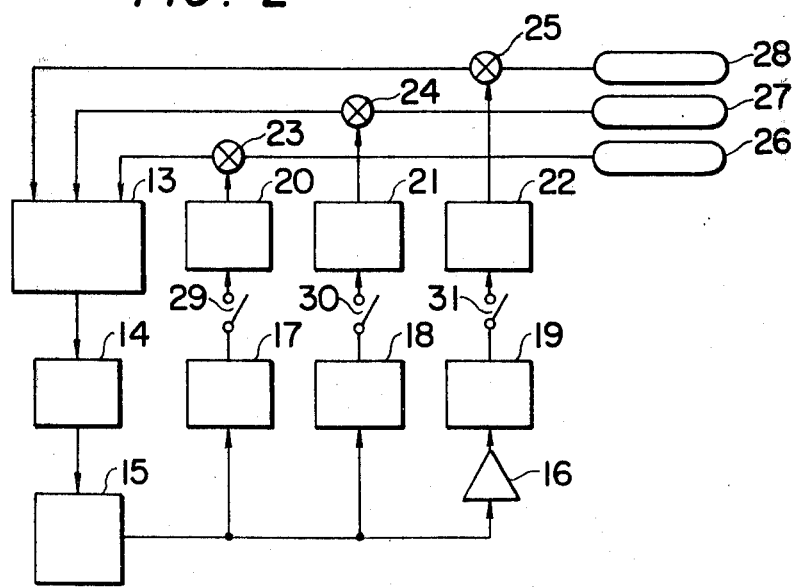
FIG. 2 is a system diagram showing one embodiment of the present invention.

FIG. 2 is a system diagram showing one embodiment of the present invention.

In FIG. 2, reference numeral 13 denotes the C V D apparatus, which is detailed in FIG. 1. The method will now be described by taking $SiO_2$ as an example of the film and Si wafer as an example of the substrate. Valves 23, 24 and 25 for adjusting flow rates $N_2$, $O_2$ and Ar containing 4% of $SiH_4$ (hereinafter referred to merely as "$SiH_4$ gas") from tanks 26, 27 and 28 are appropriately opened and these gases are introduced at prescribed flow rates into the C V D apparatus 13 to allow the reaction among these gases to proceed. With the lapse of the reaction time, $SiO_2$ particles are formed in a space 10 in the reactor, and as the number of particles increases, the particles grow to form larger particles. This growth state is observed by a particle detection monitor 14 and a signal pulse for obtaining a control signal is generated.

It is important that the monitor 14 should have a function of detecting in a real time the particle size distribution of the film-forming substance particles formed in the reactor of the C V D apparatus 13.

Figure 3:
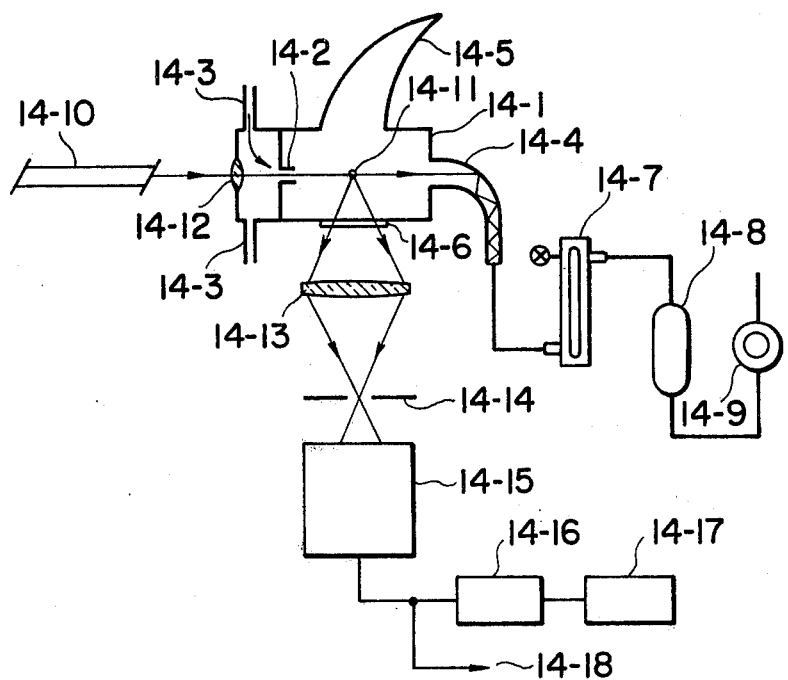
FIG. 3 is a diagram showing one embodiment of the particle monitor shown of FIG. 2.

FIG. 3 shows an embodiment of the monitor having the above function. The structure of the monitor will now be described briefly by reference to FIG. 3.

A light scattering cell 14-1 is provided with an aerosol nozzle 14-2, an inlet nozzle for an aerosol 14-3, a suction nozzle (acting also as a light trap) 14-4, a light trap horn 14-5 and a exit window 14-6. An aerosol is introduced into the light scattering cell 14-1 through the inlet nozzle of the aerosol and aerosol nozzle 14-2. This introduction is accomplished by a sucking action of a suitable suction pump 14-9 through a suction nozzle 14-4, a flow meter 14-7 and a reservoir 14-8. Accordingly, in the light scattering cell 14-1, the aerosol flows from the aerosol nozzle 14-2 toward the suction nozzle 14-4.

A laser 14-10 for generating light beams directed to the suction nozzle 14-4 through the interior of the aerosol nozzle 14-2 is disposed as a light source (a He-Ne laser) for illuminating light to the aerosol introduced in the light scattering cell 14-1 along the flowing direction of the aerosol. Convergent lens 14-12 is disposed to focus the light beams on a particle sensing zone 14-11 in the light scattering cell 14-1. Light scattered by particles in the aerosol in the particle sensing zone 14-11 (side-way scattered light) is taken out outside of the side way of the light scattering cell 14-1 from the exit window 14-6. Collective lens 14-13 is disposed to make the most of the scattered light. The collective lens 14-13 is arranged so that one focal point thereof is located in the particle sensing zone 14-11 and a slit 14-14 is disposed at the other focal point, whereby the space of the scattering zone is restricted. Namely, every time a particle passes through the particle sensing zone 14-11 having a width corresponding to the width of the slit 14-14, scattered light by this passage is incident on the slit 14-14 in the state of a pulse. The scattered light from the slit 14-14 is converted to an electric signal by a light detector 14-15 (for example, a photoamplifier including a preamplifier). Accordingly, the signal obtained is also the pulse (signal pulse), and the particle size is measured from the height of the signal pulse and the number of particles is measured from the number of signals. When the particle size range to be measured is divided into a suitable number of channels, pulse numbers are counted with respect to each of the channels and means for displaying the counted numbers are disposed, the particle size distribution can be measured. Reference number 14-16 denotes a signal processing means disposed for performing the measurement in this manner, and reference numeral 14-17 denotes a display means. As the signal processing means, there can be utilized a desirable number of channels among channels of the signal convertor shown in FIG. 4, in the state arranged in parallel.

The arrangement of such particle detection monitor has already been proposed by some of the present inventors in Japanese Patent No. 19486/75.

Connection of the above-mentioned monitor to the C V D apparatus can be performed by connecting the inlet nozzle of the aerosol 14-3 of the monitor 14 to the aerosol suction nozzle 9 of the C V D apparatus. By this arrangement, the particle size distribution of the film-forming substance particles formed in the reactor can be monitored moment by moment. Signal pulses obtained from the monitor 14 are taken out from a terminal 14-18 shown in FIG. 3 and introduced into the signal convertor 15.

Figure 4:
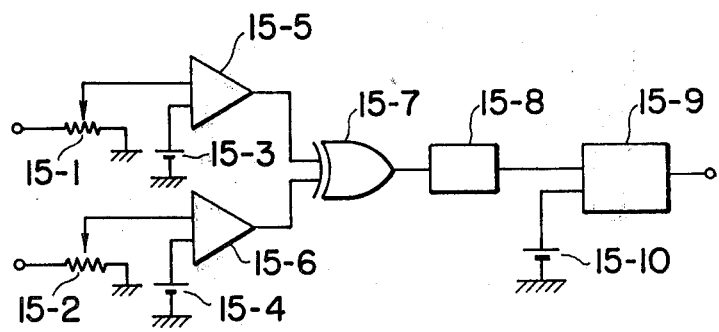
FIG. 4 is a diagram showing an embodiment of the signal convertor shown of FIG. 2.

FIG. 4 illustrates an instance of the signal convertor 15 shown in FIG. 2. The signal convertor will now be described briefly by reference to FIG. 4.

Figure 5:
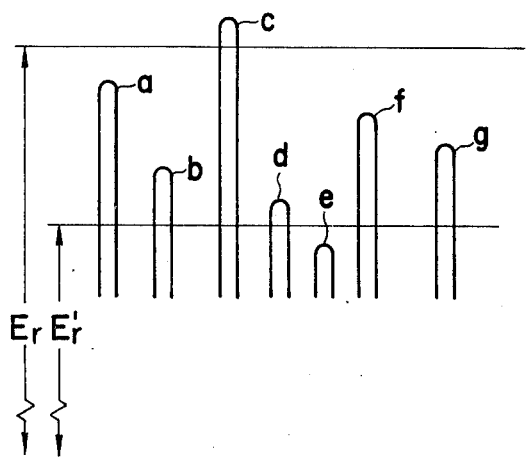
FIG. 5 is a diagram illustrating the operation of the signal convertor of FIG. 2.
Figure 6:
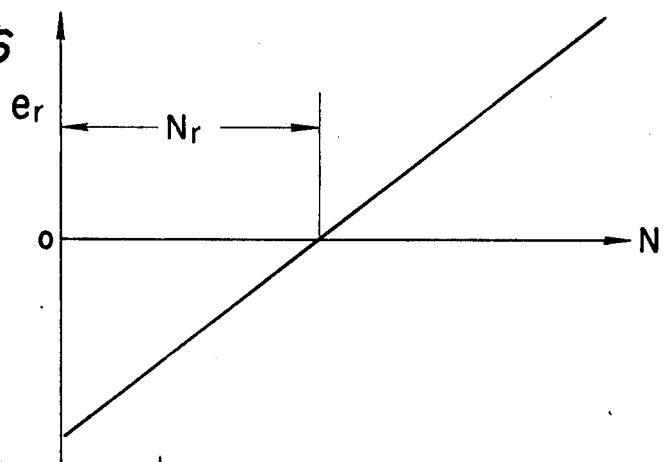
FIG. 6 is a characteristic curve of the signal convertor.

Signal pulses which reach the signal convertor 15 are put in two digital pulse convertors 15-5 and 15-6 through attenuators 15-1 and 15-2. In the first digital pulse convertor 15-5, signal pulses exceeding the reference voltage (15-3) are converted to digital pulses, and in the second digital convertor 15-6, signal pulses exceeding the reference voltage E' (15-4) are converted to digital pulses. Pulses between reference voltages E and E' are extracted from outpub pulses from the convertors 15-5 and 15-6 through EXOR element 15-7. Referring now to FIG. 5, only pulses $a$, $b$, $d$, $f$ and $g$ are extracted by the above procedure. These output pulses are integrated by an integrator 15-8 and they are converted to a direct current proportioned to the pulse number. Then it is put in an adder 15-9 where a voltage $e_r$ (15-10) corresponding to the reference pulse number N is added, to thereby import characteristics shown in FIG. 6 to the electric signal. Namely, if $N_r > N$, $e_r$ is negative, if $N_r = N$, $e_r$ is zero, and $N_r < N$, $e_r$ is positive. In the above arrangement, reference voltages E and E' and reference pulse number N are determined in advance based on experimental results as detailed hereinafter.

In the foregoing manner, the signal pulse from the monitor 14 is converted to a desired control signal by the signal convertor 15. This control signal is branched into three portions and they are put in drivers 17, 18 and 19 shown in FIG. 2, respectively. In this case, the third branch put in the driver 19 is connected through an inverter 16 for reversing the polarity of the control signal. The reason is that, as will be apparent from experimental results shown hereinafter, the tendency of formation of large particles in $O_2$ and $N_2$ is contrary to the tendency of formation of large particles in $SiH_4$. Actuators 20, 21 and 22 are operated by outputs of the corresponding drivers 17, 18 and 19, respectively, to open or close valves 23, 24 and 25 mounted on feed pipes for the respective gases or to adjust the opening degrees in these valves, whereby the flow rate of some gas is increased or the flow rate of another gas is reduced. The opening degrees of the valves 23 to 25 are arranged so that the flow rates of the respective gases are optimum values at the start of the reaction. When a certain time has passed from the point of opening or closing of the valves, the number of large particles formed in the reactor of the C V D apparatus 13 decreases. If this decrease exceeds a certain limit, a control signal of an inverse polarity to the above signal is emitted from the signal convertor 15, whereby the opening degrees of the valves are adjusted through the drivers and actuators. By controlling flow rates of the respective gases in the foregoing manner, formation of large particles having a size exceeding a certain limit can be prevented.

Figure 7:
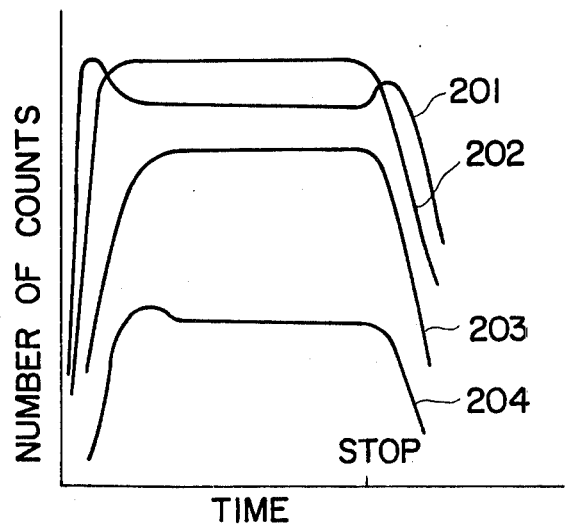
FIG. 7 is a graph illustrating the change of the particle size distribution of the film-forming substance particles.

FIG. 7 illustrates the change of the particle size distribution of $SiO_2$ particles formed at the C V D was measured for a time by using the above-mentioned monitor 14. The measurement was similarly repeated many times to obtain relations between the flow rates of the gases and the counted numbers of particles, which are as shown in FIGS. 8 to 11.

Figure 8:
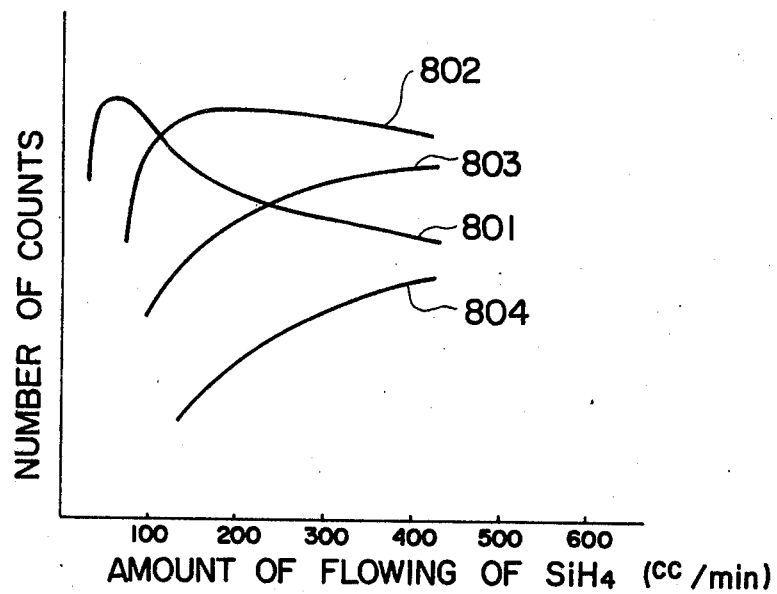

More specifically, the change of the particle size distribution with the lapse of time observed when $N_2$ flow rate was 7.2 l/min, $O_2$ flow rate was 440 cc/min and the flow rate of Ar containing 4% of $SiH_4$ was 136 cc/min, is shown in FIG. 7. In FIG. 7, curves 201, 202, 203 and 204 shown numbers of particles having a particle size of 0.1 to 0.2 $\mu$, particles having a particle size of 0.2 to 0.3 $\mu$, particles having a 0.3 to 0.4$\mu$ and particles having a particle size of 0.4 to 0.5$\mu$, respectively. In the experiment, the sample temperature was maintained at 410 ± 5° C. In experiments of FIGS. 8 to 11, this sample temperature was maintained. FIG. 8 illustrates results obtained when $N_2$ flow rate was 14.4 l/min and $O_2$ flow rate was 400 cc/min, while $SiH_4$ flow rate was changed. In FIG. 8, curves 801, 802, 803 and 804 show the numbers of particles having a particle size of 0.1 to 0.2 $\mu$, particles having a particle size of 0.2 to 0.3$\mu$, particles having a particle size of 0.3 to 0.4$\mu$ and particles having a particle size of 0.4 to 0.5$\mu$, respectively. As will be apparent from FIG. 8, formation of large particles is enhanced as $SiH_4$ flow rate is increased. When $SiH_4$ flow rate exceeds a certain critical level, formation of large particles is further enhanced and the particle size distribution is changed complicatedly at the gas phase reaction.

Figure 9:
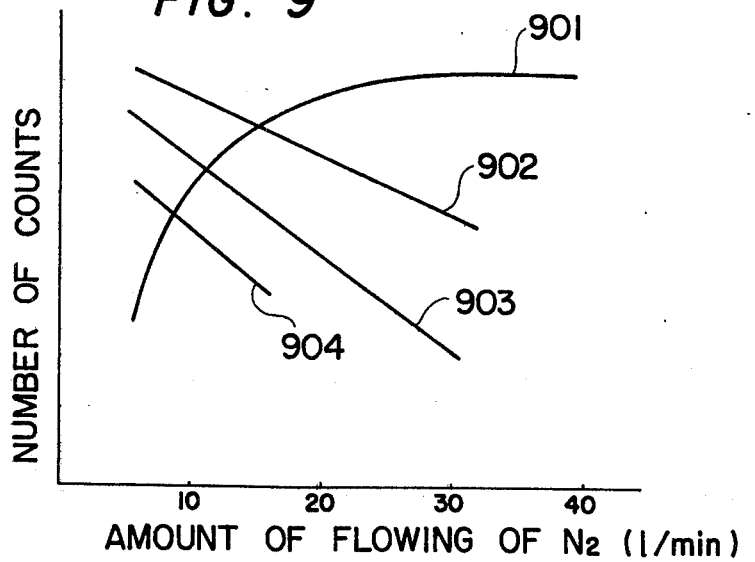

FIG. 9 illustrates results obtained when $O_2$ flow rate was 440 cc/min, and $SiH_4$ flow rate was 190 cc/min, while $N_2$ flow rate was changed. In FIG. 9, curves 901, 902, 903 and 904 show numbers of particles having a particle size of 0.1 to 0.2$\mu$, particles having a particle size of 0.2 to 0.3$\mu$, particles having a particle size of 0.3 to 0.4$\mu$ and particles having a particle size of 0.4 to 0.5$\mu$, respectively. From FIG. 9, it will readily be understood that as $N_2$ flow rate is increased, the rate of generation of large particles having a particle size larger than 0.3$\mu$ is reduced.

FIG. 10 illustrates results obtained when $N_2$ flow rate was 7.2 l/min and $SiH_4$ flow rate was 190 cc/min, while $O_2$ flow rate was changed. In FIG. 10, curves 101, 102, 103 and 104 show numbers of particles having a particle size of 0.1 to 0.2$\mu$, particles having a particle size of 0.2 to 0.3$\mu$, particles having a particle size of 0.3 to 0.4$\mu$ and particles having a particle size of 0.4 to 0.5$\mu$, respectively. As will be apparent from FIG. 10, when $O_2$ flow rate is increased, the rate of generation of large particles having a particle size larger than 0.3$\mu$ is high just after initiation of the gas phase chemical reaction, but with the lapse of the reaction time, this rate is reduced. The rate of generation of small particles having a particle size smaller than 0.3 shows quite a contrary tendency.

FIG. 11 illustrates results obtained when all of $N_2$ and $O_2$ and $SiH_4$ flow rates were changed. In FIG. 11, curves 111, 112, 113 and 114 show numbers of particles having a particle size of 0.1 to 0.2$\mu$, particles having a particle size of 0.2 to 0.3$\mu$, particles having a particle size of 0.3 to 0.4$\mu$ and particles having a particle size of 0.4 to 0.5$\mu$, respectively. As will be noted from FIG. 11, with increase of the total gas flow rate, the rate of generation of large particles having a particle size larger than 0.3$\mu$ is once reduced, but if the total gas flow rate is further increased, this rate is enhanced again.

If the foregoing experimental results are effectively utilized and the process for detecting generation of large particles at the gas phase chemical reaction and means for adjusting at the least one of $N_2$, $O_2$ and $SiH_4$ flow rates in response to signals generated from the above detecting process are appropriately driven, it is possible to prevent occurrence of the undesirable fogging phenomenon of the film-forming substance.

As such control means, there may be considered the following methods:

(1) To control $SiH_4$ flow rate alone.
(2) To control $N_2$ flow rate alone
(3) To control $O_2$ flow rate alone.
(4) To maintain one of the above three flow rates at a constant level and control the other two flow rates.
(5) To control the three gas flow rates so that the total gas flow rate is within a range of from 15 to 25 l/min.

When the controls (1) to (4) are performed in the embodiment shown in the system diagram of FIG. 2, the intended effects can easily be attained, for example, by disposing, as shown in FIG. 2, switches 29 to 31 between the drivers and actuators. More specifically, when the control is conducted according to the method (1), $N_2$ and $O_2$ flow rates are fixed to prescribe levels by valves 23 and 24, and the switches 29 and 30 are then put off.

Figure 14:
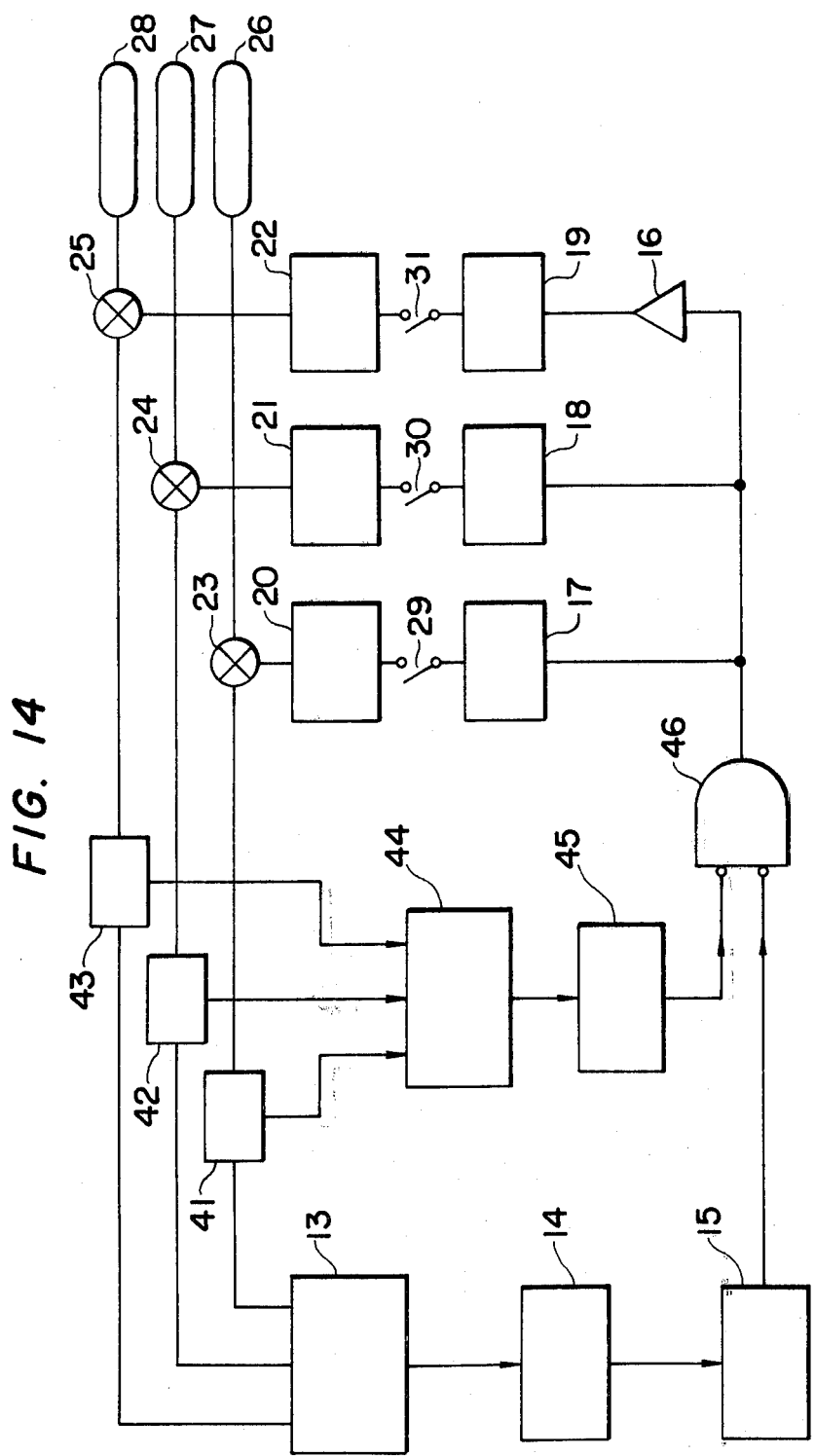
FIG. 14 is a system diagram showing still another embodiment of the present invention.

When the control method (5) is practiced, an assembly shown in FIG. 14, which comprises transducers 41, 42 and 43 for converting the respective gas flow rates to electric signals, an adder 44 for calculating the total flow rate by adding these electric signals, a device 45 for generating control signals for opening and closing valves 23, 24 and 25 and an AND circuit 46, is added to the system illustrated in FIG. 2.

Figure 12:
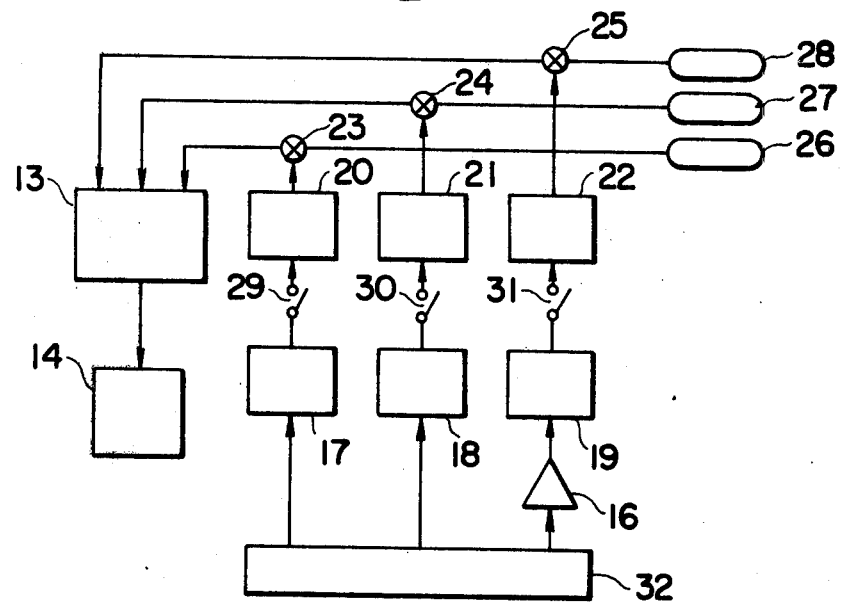
FIG. 12 is a system diagram showing another embodiment of the present invention.

Another embodiment of the present invention will now be described by reference to FIG. 12.

As illustrated in FIG. 7, the change of the particle size distribution with the lapse of the reaction time can be determined by experiments such as mentioned above. Based on these experimental results, control signals for opening or closing valves 23 to 25 or adjusting the opening degrees thereof can be programmed in advance so that the three gas flow rates can be controlled with the lapse of the reaction time. In this case, as shown in FIG. 12, a program controller 32 is disposed instead of the signal convertor shown in FIG. 2. Different from the embodiment shown in FIG. 2, the total system is of the opened loop in this embodiment. This program controller 32 is operated manually only at the starting time of the reaction, but then it automatically put out signals necessary for performing all the operations inclusive of the operation of stopping the feed of gases when a film of a desired thickness is obtained.

Figure 13:
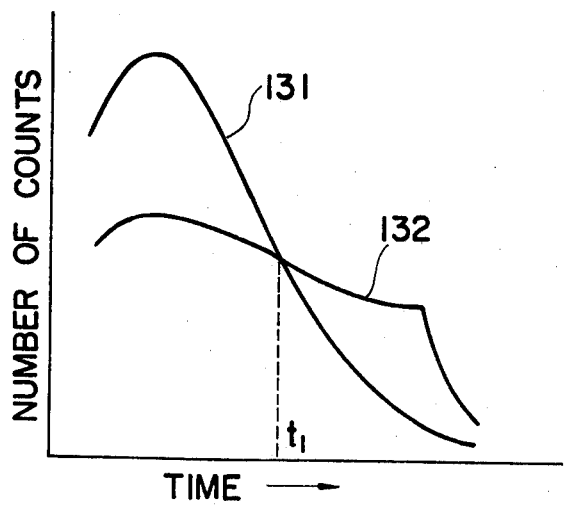
FIG. 13 is a graph illustrating the principle of the apparatus shown of FIG. 12.

FIG. 13 illustrates results obtained when the change of the number of $SiO_2$ particles having a particle size of 0.4 to 0.5$\mu$ with the lapse of the reaction time was determined while conducting the reaction by maintaining $N_2$ and $O_2$ flow rates at constant levels and changing $SiH_4$ flow rate. In FIG. 13, curve 131 shows results obtained when $SiH_4$ flow rate was 270 cc/min and curve 132 show results obtained when $SiH_4$ flow rate was 440 cc/min. From FIG. 13, it will be understood that the rate of generation of the particles is higher in curve 131 than in curve 132 before the point $t_1$ and the rate of generation of the particles is higher in curve 132 than in curve 131 after the point $t_1$. Accordingly, it is seen that if SiH$_4$ flow rate is maintained at 440 cc/min during a period ranging from the initial step of the reaction to the point $t_1$ and SiH$_4$ flow rate is maintained at 270 cc/min after the time $t_1$ has passed, the rate of generation of large particles can be reduced throughout the reaction. In short, if this relation is stored in the program controller 32, the intended effects can be attained sufficiently. The same will hold good with respect to other gases, N$_2$ and O$_2$.

As is apparent from the foregoing illustration, in forming a film of a prescribed substance on a substrate by C V D, according to the present invention, the particle size of the film-forming substance particles formed in the reactor is detected in a real time, the detected particle size is converted to an electric signal, and the flow rates of gases to be introduced into the reactor are controlled in response to this electric signal, whereby the undesirable fogging phenomenon of the film-forming substance can be effectively prevented. Therefore, formation of defects owing to this fogging phenomenon, such as pin holes and flakes can be prevented and a coating free of these defects and meeting all of the above-mentioned requirements can be obtained according to the present invention. Accordingly, the entire coated surface of the substrate can be utilized, and hence, the yield can be improved and the cost can be reduced.

What we claim is:

1. In a process for chemical vapor deposition of particles of a film-forming substance on a substrate wherein the particles result from a reaction of gases of a gaseous mixture in a reactor, the improvement comprising measuring optically the particle size of particles of the film-forming substance formed in the reactor, converting the optically measured value to an electric signal, and controlling the flow rate of at least one gas of the gaseous mixture to be introduced into the reactor in response to the electric signal whereby a good quality film is produced.

2. A process according to claim 1, wherein the flow rate of at least one of the gases introduced in the reactor is controlled and the flow rates of the other gases are maintained at a constant level.

3. A process according to claim 1, wherein the flow rate of one of the gases introduced into the reactor is maintained at a constant level and the flow rates of the other gases are controlled.

4. A chemical vapor deposition control method according to claim 1 wherein the total flow rate of all the gases introduced into the reactor is controlled.

5. A process according to claim 4, wherein the total flow rate is controlled within a fixed range.

6. In a process for chemical vapor deposition of particles of a film-forming substance on a heated substrate wherein the particles result from a reaction of a reacting gas and a component of a mixed gas in a reactor, the improvement comprising measuring optically the size of particles of the film-forming substance formed in the reactor, converting the optically measured value to an electric signal, detecting the particle size as the electric signal and controlling the flow rate of at least one of the reacting gas and mixed gas in response to the electric signal.

7. A process according to claim 6, wherein the total flow rate of the reacting gas and mixed gas is controlled.

8. A process according to claim 7, wherein the total flow rate is controlled within a fixed range.

9. A process according to claim 6, comprising measuring optically the size of the particles by withdrawing particles of the film-forming substance from the reactor for effecting chemical vapor deposition, passing the withdrawn film-forming substance particles through a light scattering cell in the form of an aerosol, directing a laser light beam through the light scattering cell wherein the particles of the film-forming substance cause scattering of the light beam, receiving light scattered by the particles from the light scattering cell, and generating a control signal in response to the received scattered light, which is a measure of the particle size distribution in the aerosol.

10. A process according to claim 6, wherein the reacting gas is oxygen and the mixed gas is a mixture containing nitrogen and silane.

11. A process according to claim 6, wherein the flow rate of the reacting gas is controlled and the flow rate of a component of the mixed gas is maintained at a constant level.

12. A process according to claim 6, wherein the flow rate of at least one component of the mixed gas is controlled and the flow rate of the reacting gas is maintained at a constant level.

13. In a process for forming a film of a substance on a substrate from a reacting gas of one of oxygen and ammonia and a multicomponent mixed gas containing nitrogen and silane by a chemical vapor deposition, the improved method for controlling the chemical vapor deposition which comprises measuring optically the size of particles of the film-forming substance formed in a reactor, converting the optically measured value to an electric signal, detecting the particle size as the electric signal and controlling the flow rate of at least one of the reacting gas and a component of the mixed gas in response to said electric signal.

14. A chemical vapor deposition control method according to claim 13, wherein the flow rate of one component of the mixed gas is controlled.

15. A chemical vapor deposition control method according to claim 13, wherein the flow rate of both components of the mixed gas is controlled.

16. A chemical vapor deposition control method according to claim 13, wherein the flow rate of the reacting gas is controlled.

17. A chemical vapor deposition control method according to claim 13, wherein the flow rate of one component of the mixed gas is maintained at a constant level and the flow rates of the reacting gas and the other component of the mixed gas are controlled.

18. A chemical vapor deposition control method according to claim 13, wherein the total flow rate of the reacting gas and mixed gas is controlled.

19. A chemical vapor deposition control method according to claim 18, wherein the total flow rate is controlled within a fixed range.

20. A chemical vapor deposition control method according to claim 13, wherein the silane is diluted with argon.

21. A chemical vapor deposition control method according to claim 13, wherein the reacting gas is oxygen and the mixed gas contains nitrogen and silane.

22. A chemical vapor deposition control method according to claim 21, wherein the silane is diluted with argon.

23. A chemical vapor deposition control method according to claim 13, wherein the mixed gas further contains phosphine.

24. A chemical vapor deposition control method according to claim 13, comprising measuring optically the size of the particles by withdrawing particles of the film-forming substance from the reactor for effecting chemical vapor deposition, passing the withdrawn film-forming substance particles through a light scattering cell in the form of an aerosol, directing a laser light beam through the light scattering cell wherein the particles of the film-forming substance cause scattering of the light beam, receiving light scattered by the particles from the light scattering cell, and generating a control signal in response to the received scattered light, which is a measure of the particle size distribution in the aerosol.

25. A chemical vapor deposition control method according to claim 13, wherein the reactor is a belljar type.

* * * * *